(12) United States Patent
Holmberg et al.

(10) Patent No.: US 11,336,196 B2
(45) Date of Patent: May 17, 2022

(54) ARRANGEMENT FOR EARTHING A DC INTERMEDIATE LINK

(71) Applicant: Bombardier Transportation GmbH, Berlin (DE)

(72) Inventors: Christer Holmberg, Västerås (SE); Tommy Carlsson, Västerås (SE)

(73) Assignee: Bombardier Transportalion GmbH, Berlin (DE)

( * ) Notice: Subject to any disclaimer, the term of this patent is extended or adjusted under 35 U.S.C. 154(b) by 283 days.

(21) Appl. No.: 16/789,689

(22) Filed: Feb. 13, 2020

(65) Prior Publication Data

US 2020/0266725 A1 Aug. 20, 2020

(30) Foreign Application Priority Data

Feb. 18, 2019 (SE) ................... 1950200-4

(51) Int. Cl.
*H02M 7/00* (2006.01)
*B60R 16/03* (2006.01)
*H05K 5/02* (2006.01)
*H05K 5/03* (2006.01)

(52) U.S. Cl.
CPC ............ *H02M 7/003* (2013.01); *B60R 16/03* (2013.01); *H05K 5/023* (2013.01); *H05K 5/03* (2013.01)

(58) Field of Classification Search
None
See application file for complete search history.

(56) References Cited

U.S. PATENT DOCUMENTS

| 10,892,682 | B2* | 1/2021 | Dilley | .................. H02M 3/158 |
| 2012/0063176 | A1 | 3/2012 | Yamasaki et al. | |
| 2016/0315540 | A1* | 10/2016 | Dilley | .................. H02M 3/158 |
| 2018/0297478 | A1 | 10/2018 | Wang et al. | |

FOREIGN PATENT DOCUMENTS

| EP | 2 020 332 A1 | 2/2009 |
| WO | 2009/088977 A1 | 7/2009 |

* cited by examiner

*Primary Examiner* — Rexford N Barnie
*Assistant Examiner* — Terrence R Willoughby
(74) *Attorney, Agent, or Firm* — Dilworth & Barrese, LLP

(57) ABSTRACT

An arrangement for earthing a DC intermediate link connected to a converter on board a track-bound vehicle is configured to be permanently arranged on board the vehicle and comprises two conducting members (23, 24) permanently connected to a pole each of a DC intermediate link and to a first contact member (29, 30) each movably arranged with respect to second contact members (35, 36) permanently connected to a chassis part of the vehicle connected to earth. A handle (34) is connected to the first or second contact members while being electrically insulated with respect thereto to be manually operated for moving the contact members connected thereto between a position of not earthing and a position of earthing the DC intermediate link.

20 Claims, 5 Drawing Sheets

ARRANGEMENT FOR EARTHING A DC INTERMEDIATE LINK

TECHNICAL FIELD OF THE INVENTION AND BACKGROUND ART

The present invention relates to an arrangement for earthing a DC intermediate link connected to a converter on board a track-bound vehicle. Although the present invention is particularly directed to railway vehicles it does also cover other types of vehicles being track-bound, such as buses and trucks.

When maintenance is to be carried out on such converters or other parts of the electric system connected thereto separation contactors are usually first controlled to obtain a zero voltage at the converter, but it is then for safety reason also important to earth the DC intermediate link connected to the converter so that the voltage may not accidentally return during the maintenance work.

Such earthing of a DC intermediate link connected to a converter has so far been carried out by large and heavy equipment, such as grounding rods, carried by people to performing the maintenance. This equipment is not only bothersome to carry along and handle, but the safety provided thereby may in some situations not be as high as desired, especially since such equipment laborious to handle may create temptations to not handle the equipment strictly in the way required.

Accordingly, there is a desire to provide an arrangement for earthing a DC intermediate link connected to a converter on board a track-bound vehicle being easy to handle and improving the safety for personal accessing such converters during maintenance with respect to such arrangements already known.

SUMMARY OF THE INVENTION

The object of the present invention is to provide an arrangement of the type defined in the introduction being improved in at least some aspect with respect to such arrangements already known.

This object is obtained by providing such an arrangement with the features described herein.

Thus, the arrangement is configured to be permanently arranged on board a track-bound vehicle, which means that it has not to be carried along and brought to a place of use thereof, but it is ensured that it is always on board the track-bound vehicle ready to be used. The arrangement has two conducting members configured to have one end permanently connected to a pole each of a DC intermediate link and the other end connected to a first contact member each configured to be movably arranged with respect to a second contact member permanently connected to a chassis part of the vehicle connected to earth. The first contact members are movable with respect to the second contact members between an open position not earthing said DC intermediate link and a contacting closed position earthing the DC intermediate link. Furthermore, a handle is connected to the first or second contact members while being electrically insulated with respect thereto to be manually operated for moving the contact members connected thereto between a position of not earthing and a position of earthing the DC intermediate link.

Thus, the arrangement is permanently on the place where it is to be used and has also permanently said first contact members connected to the poles of a DC intermediate link to be earthed making it possible to easily and reliably obtain earthing of the DC intermediate link of the converter in question by simply manually operating the handle connected to the first or second contact members, which may be carried out without exposing the maintenance operator for any type of danger.

A separate arrangement of this type is preferably arranged for all converters, for example line converters and motor converters, on board the track-bound vehicle, which allows the maintenance operator to be certain that the DC intermediate link of a specific converter is earthed independently from the rest of the system.

According to an embodiment of the invention the arrangement comprises a carrier onto which both contact members connected to the handle are arranged and which is guidedly displaceable along a member fixed with respect to said chassis part. The contact members connected to the handle may by this through operating the handle comfortably be brought to the state of contacting the other contact members and earthing the DC intermediate link. The member fixed with respect to the chassis part has not to be secured to a chassis part, but it has only to be immovable with respect to the chassis part.

According to another embodiment of the invention said carrier has at least portions made of insulating material connecting the carrier and by that the contact members arranged thereon to said handle.

According to another embodiment of the invention said first contact members are plate-like metal members, and according to a further development of this embodiment the second contact members are configured to bear under pretension against large surfaces of the first contact members in a closed position, which ensures that the earthing state is reliably maintained once it has been obtained.

According to another embodiment of the invention each said second contact member forms a jaw configured to receive a said first contact member while bearing under pretension from opposite directions thereagainst in said closed position. A reliable contact making between the first and second contact members and by that an earthing of the DC intermediate link in the closed position is by this guaranteed.

According to another embodiment of the invention the arrangement is configured to be arranged inside a converter casing with said handle accessible to be operated under the condition that a front cover of the casing is removed for exposing an opening into the casing. The handle may by this not be unintentionally moved to an earthing position when this is not asked for, since the front cover of the converter casing has to be removed for operating the handle and this is only done when a maintenance operator is really going to carry out maintenance work.

According to another embodiment of the invention the handle is configured to be arranged to be pulled out of the casing for obtaining said contacting closed position and pushed into the casing for obtaining said open position. This ensures that a DC intermediate link may not be left earthed by the arrangement when the front cover has been brought into place, since applying the front cover to the casing requires a pushing of the handle into the casing and by that resulting in an open position of the contact members of the arrangement.

According to another embodiment of the invention the front cover is in a position of closing the opening of the casing configured to hold the handle in a position corresponding to a position of said contact members not earthing the DC intermediate link. It is by this ensured that the earthing arrangement is always in the neutral not earthing position as long as the front cover is closing the casing opening.

According to another embodiment of the invention the arrangement comprises means for locking the handle with the first and second contact members in the closed position. This ensures that a maintenance operator or any other person may not unintentionally move the handle and causing a non-earthing position of the arrangement when work is carried out for the converter in question.

According to another embodiment of the invention said means is configured to lock the handle with the first and second contact members in the closed position in a position of the handle preventing said front cover to closing the converter casing opening. This ensures that the front cover may not be put in place as long as the DC intermediate link is earthed.

According to another embodiment of the invention said conducting members are flexible, which simplifies the creation of an arrangement with the properties aimed at through the invention. The conducting members are then preferably electrical cables.

The invention also relates to a method for earthing a DC intermediate link connected to a converter on board a track-bound vehicle, which is characterized by utilising an arrangement according to the invention and by carrying out the steps of opening a front cover of a converter casing containing said converter and DC intermediate link and pulling the handle out through a casing opening previously covered by the front cover to a position in which the first contact members and the second contact members are in mutual contact connecting the DC intermediate link to earth. This way of obtaining said earthing will avoid that unintentional closing of the front cover is taking place.

According to an embodiment of the invention the method comprises the further step of locking the handle in the pulled out position for preventing the handle to be unintentionally pushed into the casing to a position corresponding to not earthing the DC intermediate link.

The invention also relates to a track-bound vehicle having for at least one, preferably all, converters on board thereof an arrangement according to the invention for earthing a DC intermediate link connected to the converter.

Further advantages as well as advantageous features of the invention will appear from the description following below.

BRIEF DESCRIPTION OF THE DRAWINGS

With reference to the appended drawings, below follows a specific description of an embodiment of the invention cited as an example.

In the drawings.

DETAILED DESCRIPTION OF AN EMBODIMENT OF THE INVENTION

Figure 1:
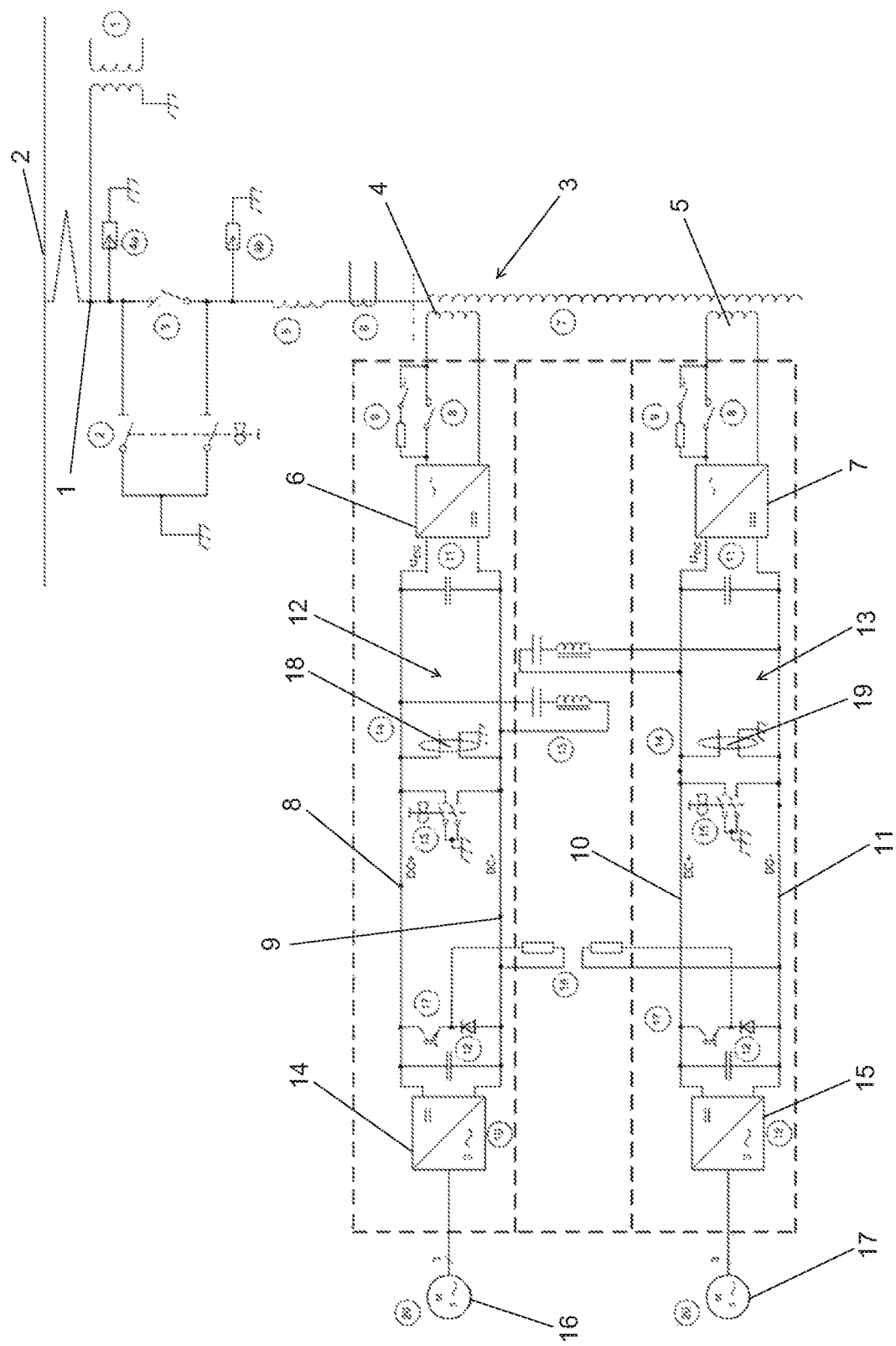
FIG. 1 is a very schematic view illustrating how different types of converters may be arranged in a track-bound vehicle.

FIG. 1 illustrates schematically how electric power may be fed to a track-bound vehicle 1 from an AC-supply line 2 and used in the vehicle. The vehicle is configured to move along the AC-supply line 2 which accordingly acts as an AC-source and which may for example carry a single phase alternating voltage of 15 kV and 16 ⅔ Hz (Sweden, Germany etc.) or 25 kV and 50 Hz (Denmark, China, India etc.). The vehicle has a transformer 3 for transforming the voltage from the supply line 2 to a suitable level. The transformer has here two secondary windings 4, 5 connected to a line converter 6, 7 each for delivering a direct voltage of for example 0.8-3 kV on the output thereof. Thus, this direct voltage is then present between poles 8, 9 and 10, 11 of DC intermediate links 12 and 13, respectively. These DC intermediate links are connected to an input of a motor converter 14, 15 each controlled for delivering a three-phase alternating voltage on the output thereof to motors 16, 17 for the propulsion of the vehicle. Electric power may in a corresponding way be delivered from a corresponding DC intermediate link to an auxiliary converter for providing electric power to sockets arranged in the track-bound vehicle, such as for connection of computers, and to lighting, heating and other appliances.

It is schematically illustrated how an arrangement 18, 19 for earthing the respective DC intermediate link 12, 13 is arranged in connection therewith.

Figure 2:
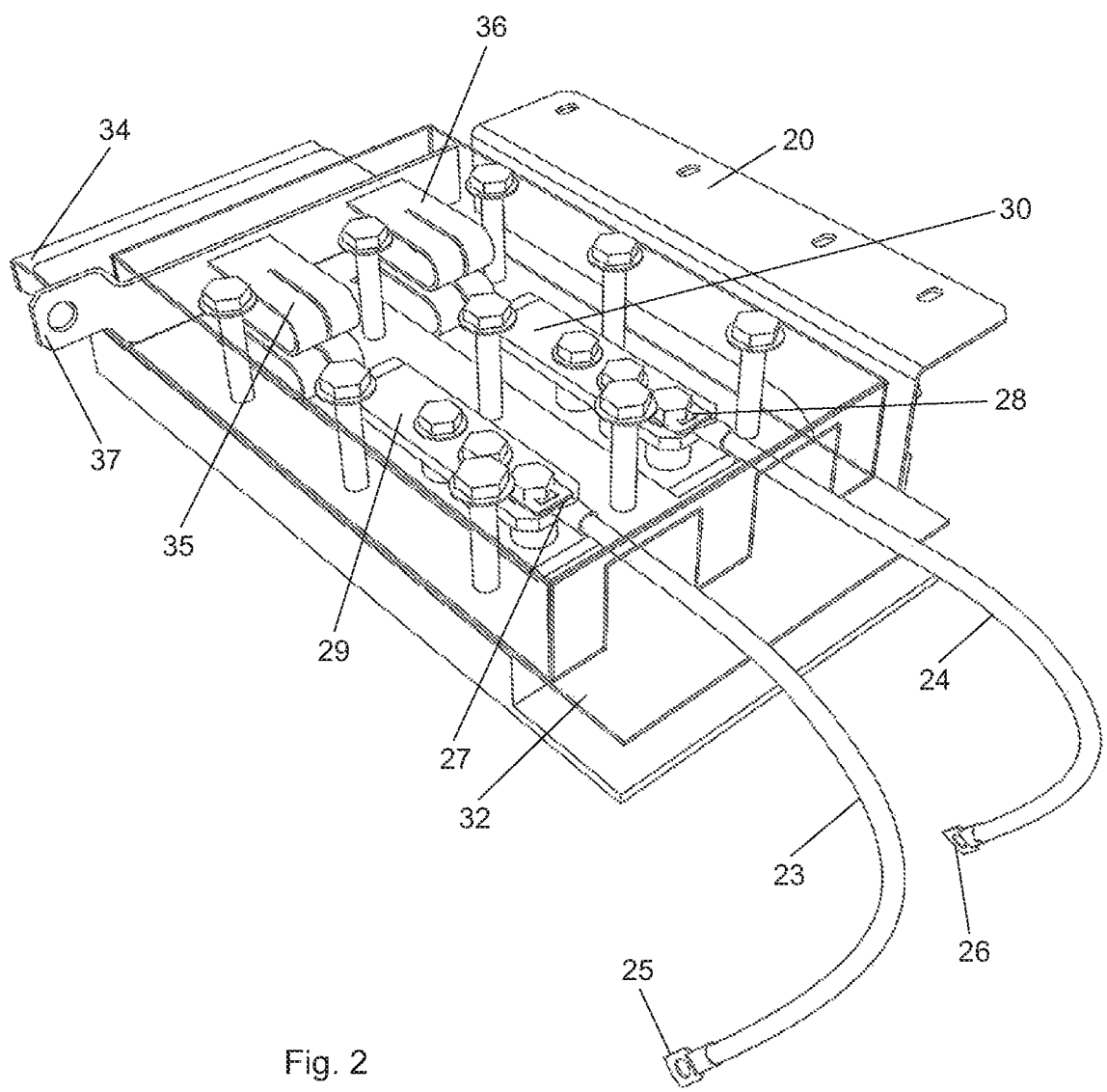
FIG. 2 is a perspective view of an arrangement according to an embodiment of the invention in a position of not earthing a DC intermediate link connected to a converter.
Figure 4:
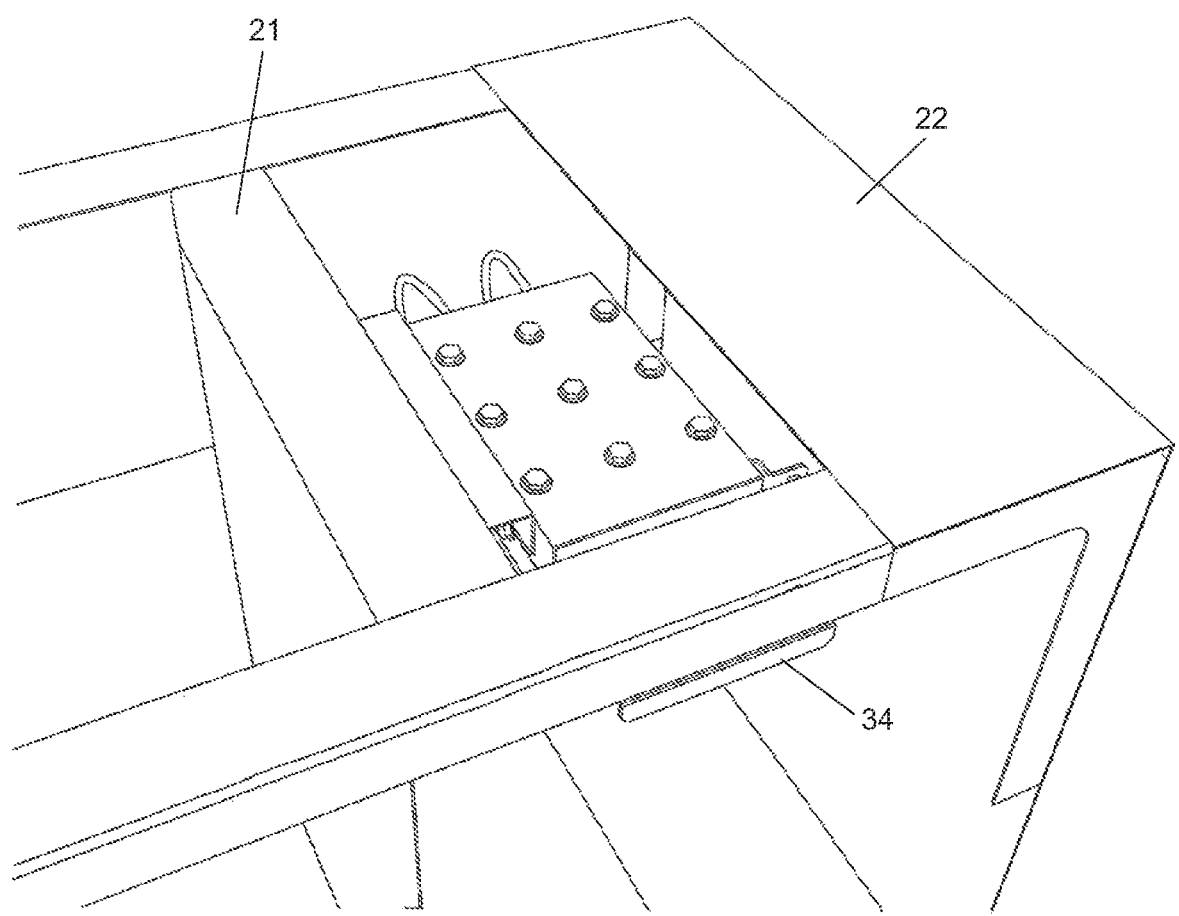
FIG. 4 is a view illustrating a converter casing containing an arrangement according to FIGS. 2 and 3 with the front cover removed from the casing and the arrangement in the position of not earthing a said DC intermediate link.

FIG. 2 shows such an arrangement according to an embodiment of the invention. The arrangement has a frame with a bracket 20 for securing the arrangement to the frame 21 (see FIG. 4) of a converter casing 22 containing the converter and electronic equipment associated with the control thereof and also the DC intermediate link connected thereto.

The arrangement has two conducting members 23, 24 in the form of electrical cables configured to have one end 25, 26 connected to a pole each of a DC intermediate link and the other end 27, 28 connected to a first contact member 29, 30 each in the form of a metal plate. The first contact members 29, 30 are arranged on a carrier 31 being guidedly displaceable along a member 32 fixed with respect to a chassis part of the vehicle through the bracket 20. The carrier 31 has at least portions 33 made of insulating material connecting the carrier and by that the first contact members 29, 30 to a handle 34.

The arrangement further comprises second contact members 35, 36 permanently connected to a chassis part of the vehicle connected to earth through an earth connecting member 37.

Figure 3:
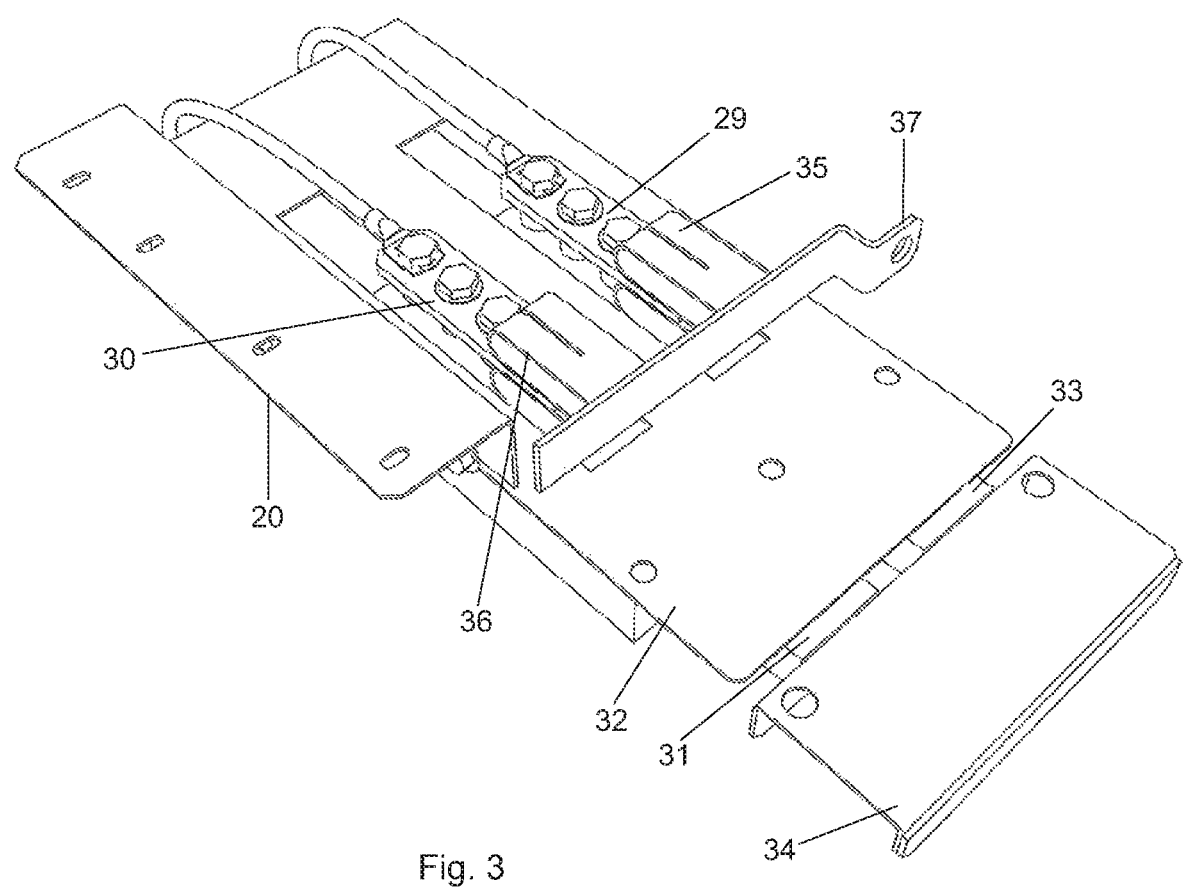
FIG. 3 is a perspective view of the arrangement shown in FIG. 2 in a position of earthing a said DC intermediate link connected to a converter.

The first contact members 28, 29 are movable with respect to the second contact members 35, 36 between an open position not earthing said DC intermediate link shown in FIG. 2 and a contacting closed position earthing the DC intermediate link shown in FIG. 3. The second contact members 35, 36 are designed as jaws configured to receive the first contact member while bearing under pretension from opposite directions thereagainst in the closed position shown in FIG. 3.

Figure 5:
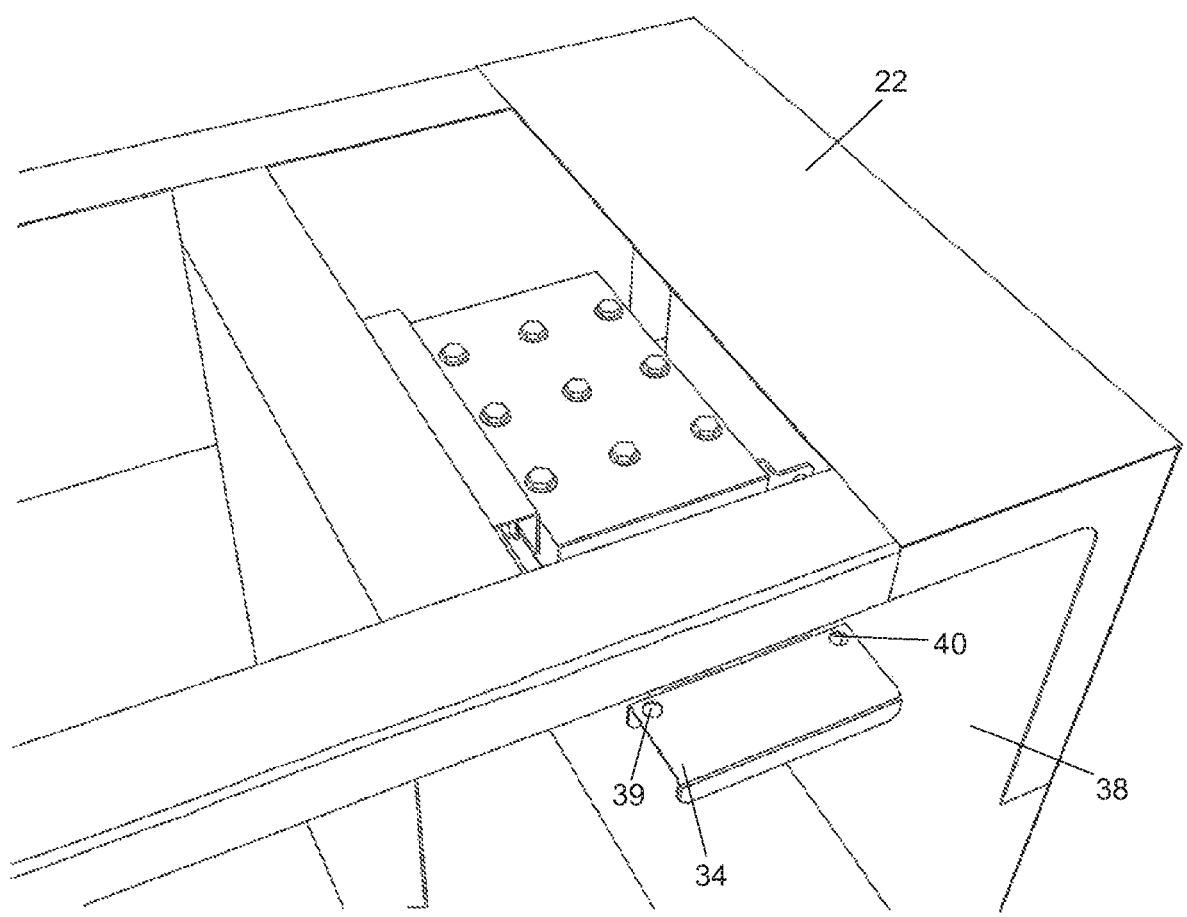
FIG. 5 is a view corresponding to FIG. 4 with a handle of the arrangement pulled out through the casing opening and the arrangement in a position of earthing said DC intermediate link.

When maintenance work is to be carried out in a converter casing a separation contactor is controlled to obtain a zero voltage between the poles of the DC intermediate link, which however in some cases will in fact be a voltage differing from zero, such as 24 V, still remaining. The front cover is then removed from the converter casing 22 to expose the handle 34 of the arrangement as shown in FIG. 5. It is shown how the front cover has pushed the handle into the casing to ensure that the arrangement is in a not earthing state when the front cover is put in place.

The handle 34 is then gripped by the maintenance operator and pulled out of the casing opening 38 to the position shown in FIG. 5 in which the first contact members 29, 30 has been brought into contact with the second contact members 35, 36 and by that the poles of the DC intermediate link in contact with a chassis part of the vehicle for earthing the DC intermediate link.

It is shown in FIG. 5 how the handle 34 has through-holes 39, 40 to enable applying a lock to the handle ensuring earthing of the DC intermediate link to be maintained once obtained by preventing unintentional pushing of the handle into the converter casing 22.

The invention is of course in no way restricted to the embodiment described above, since many possibilities for modifications thereof are likely to be obvious to one skilled in the art without having to deviate from the scope of the invention defined in the appended claims.

The handle may be connected to the second contact members then movable for obtaining the movement of the contact members with respect to each other between said open position not earthing the DC intermediate link and said contacting closed position earthing the DC intermediate link. The second contact members may then be permanently connected to a said chassis part connected to earth by conducting members, such as flexible electrical cables.

FIG. 1 shows the invention applied to earthing a DC intermediate link connected to a converter on board a track-bound vehicle fed by an AC-supply line, but the earthing arrangement according to the invention may also be used for DC applications, such as having DC supplies of 750 VDC or 1500 VDC.

Auxiliary contacts inside the earthing device not shown in the figures are configured to detect the position of the earthing device, and information provided thereby may be used to supervise the position of the earthing device and to interlock power contactors upstreams to be energized and connect voltage to the DC intermediate link.

The invention claimed is:

1. An arrangement for earthing a DC intermediate link connected to a converter on board a track-bound vehicle, configured to be permanently arranged on board a track-bound vehicle and comprising:
    two conducting members configured to have one end permanently connected to a pole of a DC intermediate link and the other end connected to
    a first contact member configured to be movably arranged with respect to
    second contact members permanently connected to a chassis part of the vehicle connected to earth, in which the first contact members are movable with respect to the second contact members between an open position not earthing said DC intermediate link and a contacting closed position earthing the DC intermediate link, and
    a handle is connected to the first or second contact members while being electrically insulated with respect thereto to be manually operated for moving the contact members connected thereto between a position of not earthing and a position of earthing the DC intermediate link.

2. An arrangement according to claim 1, comprising a carrier onto which both contact members connected to the handle are arranged and which is guidedly displaceable along a member fixed with respect to said chassis part.

3. An arrangement according to claim 2, wherein said carrier has at least portions made of insulating material connecting the carrier and the contact members arranged thereon to said handle.

4. An arrangement according to claim 3, wherein said first contact members are plate-like metal members.

5. An arrangement according to claim 4, wherein said second contact members are configured to bear under pretention against large surfaces of the first contact members in said closed position.

6. An arrangement according to claim 2, wherein said first contact members are plate-like metal members.

7. An arrangement according to claim 6, wherein said second contact members are configured to bear under pretention against large surfaces of the first contact members in said closed position.

8. An arrangement according to claim 1, wherein said first contact members are plate-like metal members.

9. An arrangement according to claim 8, wherein said second contact members are configured to bear under pretention against large surfaces of the first contact members in said closed position.

10. An arrangement according to claim 9, wherein said second contact member forms a jaw configured to receive a said first contact member while bearing under pretention from opposite directions there against in said closed position.

11. An arrangement according to claim 1 configured to be arranged inside a converter casing with said handle accessible to be operated under the condition that a front cover of the casing is removed for exposing an opening into the casing.

12. An arrangement according to claim 11, wherein the handle is configured to be arranged to be pulled out of the casing for obtaining said contacting closed position and pushed into the casing for obtaining said open position.

13. An arrangement according to claim 11, wherein the front cover is in a position of closing the opening of the casing configured to hold the handle in a position corresponding to a position of said contact members not earthing the DC intermediate link.

14. An arrangement according to claim 1, comprising means for locking the handle with the first and second contact members in the closed position.

15. An arrangement according to claim 14, configured to be arranged inside a converter casing with said handle accessible to be operated under the condition that a front cover of the casing is removed for exposing an opening into the casing wherein said means is configured to lock the handle with the first and second contact members in the closed position in a position of the handle preventing said front cover to close the converter casing opening.

16. An arrangement according to claim 1, wherein said conducting members are flexible.

17. An arrangement according to claim 16, wherein the conducting members are electrical cables.

18. A method for earthing a DC intermediate link connected to a converter on board a track-bound vehicle, and utilizing an arrangement according to claim 1, comprising the steps of:
    opening a front cover of a converter casing containing said converter and DC intermediate link, and pulling the handle out through a casing opening previously covered by the front cover to a position in which the first contact members and the second contact members are in mutual contact connecting the DC intermediate link to earth.

19. A method according to claim 18, comprising the further step of locking the handle in the pulled-out position for preventing the handle to be unintentionally pushed into the casing to a position corresponding to not earthing the DC intermediate link.

20. A track-bound vehicle having for at least one converter on board thereof, an arrangement according to claim 1 for earthing a DC intermediate link connected to the converter.

* * * * *